United States Patent [19]
Yoshida

[11] Patent Number: 5,142,331
[45] Date of Patent: Aug. 25, 1992

[54] PHOTOELECTRIC CONVERSION SEMICONDUCTOR DEVICE

[75] Inventor: Susumu Yoshida, Itami, Japan

[73] Assignee: Mitsubishi Denki Kabushiki Kaisha, Tokyo, Japan

[21] Appl. No.: 295,265

[22] Filed: Jan. 10, 1989

[30] Foreign Application Priority Data

Jan. 22, 1988 [JP] Japan .................. 63-12864

[51] Int. Cl.⁵ .............. H01L 27/14; H01L 31/00; H01L 29/78
[52] U.S. Cl. .................. 357/30; 357/23.7; 136/256
[58] Field of Search ............ 357/30 Q, 30 S, 30 B, 357/6, 7, 23.7; 136/256

[56] References Cited

U.S. PATENT DOCUMENTS

| | | | |
|---|---|---|---|
| 3,339,075 | 8/1963 | Szepesi | 357/6 |
| 4,278,473 | 7/1981 | Borden | 437/5 |
| 4,286,278 | 8/1981 | Lorenze, Jr. et al. | 257/30 Q |
| 4,525,732 | 6/1985 | Bayraktaroglu | 357/68 |
| 4,532,699 | 8/1985 | Bourdillot et al. | 437/974 |
| 4,564,720 | 1/1986 | Hogan | 357/30 |
| 4,737,197 | 4/1988 | Nagahara | 357/30 |
| 4,872,925 | 10/1989 | McMaster | 136/244 |

FOREIGN PATENT DOCUMENTS

| | | | |
|---|---|---|---|
| 60-9177 | 1/1985 | Japan | 357/6 |
| 60-253286 | 12/1985 | Japan | 357/17 |
| 62-189763 | 8/1987 | Japan | 136/256 |

OTHER PUBLICATIONS

Crystal Research and Technology, 1981, pp. 989-994.
IEEE Transactions on Electron Devices, 1984, vol. ED-31 No. 5, pp. 637-647.

*Primary Examiner*—Andrew J. James
*Assistant Examiner*—Stephen D. Meier
*Attorney, Agent, or Firm*—Oblon, Spivak, McClelland, Maier & Neustadt

[57] ABSTRACT

A first conductivity type first semiconductor layer is formed on an insulation substrate and a second conductivity type second semiconductor layer is formed on the first semiconductor layer in order to provide a semiconductor device having a highly reliable electrode structure. In order to accomplish this electrode structure, a first electrode which is insulated from the first semiconductor layer with an insulation film, is formed on an area extending from a part of the second semiconductor layer to an exposed surface of the insulation substrate which is not covered with the first semiconductor layer. A second electrode, which is separate from the second semiconductor layer, is formed on a part of the first semiconductor layer which is not covered with the second semiconductor layer. Using this construction, a solar battery cell can be realized. Additionally, the first electrode has a connection region on the exposed surface of the insulation substrate in order to provide connection with an external terminal. This enables welding or bonding with an external terminal on this particular connection region.

4 Claims, 2 Drawing Sheets

PHOTOELECTRIC CONVERSION SEMICONDUCTOR DEVICE

BACKGROUND OF THE INVENTION

1. Field of the Invention

The present invention relates to a semiconductor device which has highly reliable electrode structure.

2. Description of the Background Art

FIG. 1 is a sectional view showing a conventional semiconductor device having photoelectric conversion function, such as a solar cell of gallium arsenide (GaAs). As shown in FIG. 1, an n-type GaAs layer 2 and a p-type GaAs layer 3 are laminated on the surface of an n-type GaAs substrate 1. A p-n junction 4 is defined between the n-type GaAs layer 2 and the p-type GaAs layer 3. Electrodes 5 are formed on both end portions and a central portion of the p-type GaAs layer 3, to be in ohmic contact with the p-type GaAs layer 3. A number of electrodes 5 are practically used and they may form a comb-type electrode. A p-type AlGaAs layer 6 is formed on a region of the p-type GaAs layer 3 provided with no such electrodes 5, and an antireflection film 7 is formed on the p-type AlGaAs layer 6. The antireflection film 7 is made of a nitride silicon film of 600 to 800 Å in thickness.

Sunlight incident upon the antireflection film 7 is transmitted through the antireflection film 7, and the p-type AlGaAs layer 6 and absorbed mainly in the p-type GaAs layer 3, to generate electron-hole pairs. Electrons, being minority carriers in the p-type GaAs layer 3, are diffused to reach and pass through the p-n junction 4 to thereby generate photoelectromotive voltage and photoelectromotive current, which are drawn out from the electrodes 5 and 8 so that radiant energy (electromagnetic energy) of the light is converted into electric power. This rate is generally called photoelectric conversion efficiency. In order to improve such photoelectric conversion efficiency, the p-type GaAs layer 3 must be minimized in thickness so that the p-n junction 4 is as close as possible to the light receiving surface.

A semiconductor device having photoelectric conversion function of this type may be used in space as a power source for an artificial satellite, and thickness of the layer 3 is preferably reduced in order to avoid damage by radiation. In general, such film thickness is about 0.5 μm.

In the aforementioned conventional semiconductor device having photoelectric conversion function, the electrodes 5 are directly formed on the p-type GaAs layer 3 in ohmic connection manner. Therefore, stress is extremely applied to the p-type GaAs layer 3, the n-type GaAs layer 2 and the p-n junction 4 taking important parts in photoelectric conversion, for connecting the electrodes 5 with external lead terminals (not shown) by a process such as welding or thermocompression bonding.

Particularly in the p-type GaAs layer 3 having thin film thickness of 0.5 μm, open voltage $V_{OC}$, curve factor FF and short-circuit current $I_{SC}$, which are correlated with photoelectric conversion efficiency, are reduced by thermal or mechanical stress for bonding. Consequently, reduction is caused in photoelectric conversion efficiency and reliability of the device.

SUMMARY OF THE INVENTION

The present invention is directed to a semiconductor device having highly reliable electrode structure and a method of manufacturing the same.

In a first aspect, a semiconductor device according to the present invention comprises an insulation substrate and lamination formed partially on a surface of the insulation substrate. The lamination has at least a first region of a first conductivity type and a second region of a second conductivity type defining a junction in a boundary between the same. The semiconductor device further includes an electrode which is formed to extend from a part of a surface of the lamination to a part of the surface of the insulation substrate not provided with the lamination and electrically connected with either the first or second region in a prescribed region of said part of the surface of the lamination. A region of the electrode provided on the surface of the insulation substrate serves as a region to be connected with an external terminal. The semiconductor device further includes an insulating film which is interposed between the lamination and the electrode in a region other than the said prescribed region to insulate the electrode from the lamination.

In a second aspect, a semiconductor device according to the present invention comprises an insulation substrate, a first conductivity type first semiconductor layer partially formed on a surface of the insulation substrate, a second conductivity type second semiconductor layer formed partially on a surface of the first semiconductor layer, an insulating layer formed to extend from a part of the surface of the insulation substrate not provided thereon with the first semiconductor layer to a part of a surface of the second semiconductor layer, a first electrode formed on another part of the surface of the insulation substrate not provided thereon with the first semiconductor layer, a surface of the insulating layer and another part of the surface of the second semiconductor layer, and electrically connected with the second semiconductor layer on said another part of the surface of the second semiconductor layer. A region of the first electrode on said another part of the surface of the insulation substrate serves as a region to be connected with an external terminal. The semiconductor device further includes a second electrode formed on a part of the surface of the first semiconductor layer not provided thereon with the second semiconductor layer, with being insulated from the second semiconductor layer.

In a third aspect, a method of manufacturing a semiconductor device according to the present invention comprises the steps of preparing an insulation substrate, forming lamination having at least a first region of a first conductivity type and a second region of a second conductivity type which define a junction in a boundary between the same on a surface of the insulation substrate, selectively etching the lamination to partially expose the surface of the insulation substrate, forming an insulating film extending from a part of a surface of the lamination to a part of the surface of the insulation substrate as exposed, and forming an electrode on another part of the surface of the insulation substrate as exposed, a surface of the insulating film and another part of the surface of the lamination to be electrically connected with either the first or second region on said another part of the surface of the lamination, a region of the electrode on said another part of the surface of the insulation substrate serving as a region to be connected with an external terminal.

In a fourth aspect, a method of manufacturing a semiconductor device according to the present invention comprises the steps of preparing an insulation substrate, forming a first conductivity type first semiconductor layer on a surface of the insulation substrate, forming a second conductivity type second semiconductor layer on a surface of the first semiconductor layer, selectively etching the first and second semiconductor layers to partially expose the surface of the insulation substrate, selecting etching the second semiconductor layer to partially expose the surface of the first semiconductor layer, forming an insulating film extending from a part of the surface of the insulation substrate as exposed to a part of a surface of the second semiconductor layer, forming a first electrode on another part of the surface of the insulation substrate as exposed, a surface of the insulating film and another part of the surface of the second semiconductor layer to be electrically connected with the second semiconductor layer on said another part of the surface of the second semiconductor layer, a region of the first electrode on said another part of the surface of the insulation substrate serving as a region to be connected with an external terminal, and forming a second electrode on a part of the surface of the first semiconductor layer as exposed, with being insulated from the second semiconductor layer.

Accordingly, an object of the present invention is to provide a semiconductor device which is adapted to improve photoelectric conversion efficiency and reliability of the device by reducing mechanical damage of semiconductor layers in bonding with an external lead terminal and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 2:
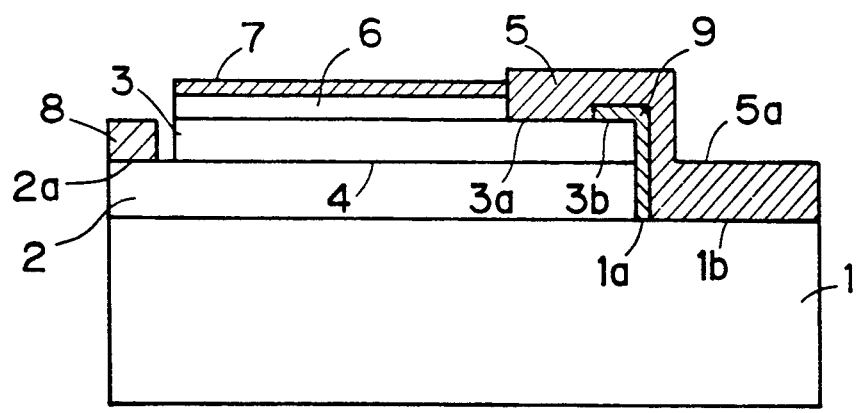
FIG. 2 is a sectional view showing a semiconductor device having photoelectric conversion function according to an embodiment of the present invention.

FIG. 2 is a sectional view showing an embodiment of a semiconductor device having photoelectric conversion function according to the present invention. As shown in FIG. 2, an n-type GaAs layer 2 is formed partially on the surface of a chrom-doped semi-insulation GaAs substrate 1 and a p-type GaAs layer 3 is formed partially on the surface of the n-type GaAs layer 2. An electrode 5 is formed over a region on the semi-insulation GaAs substrate 1 not provided with the n-type and p-type GaAs layers 2 and 3 and surface parts 3a and 3b of the p-type GaAs layer 3. An insulating film 9 is interposed between the electrode 5 and the n-type and p-type GaAs layers 2 and 3 to insulate the electrode 5 from the n-type and p-type GaAs layers 2 and 3 except for the surface part 3a of the p-type GaAs layer 3. A p-type AlGaAs layer 6 is formed on a surface region of the p-type GaAs layer 3 not provided with the insulating film 9 and the electrode 5. An antireflection film 7 is provided on the p-type AlGaAs layer 6. Further, an electrode 8 is formed on a part of an exposed surface 2a of the n-type GaAs layer 2 without contact with the p-type GaAs layer 3.

A method of manufacturing the aforementioned semiconductor device is as follows: First, the n-type GaAs layer 2 is formed on the semi-insulation GaAs substrate 1 by a liquid-phase epitaxial growth or metal organic chemical vapor deposition (MOCVD) process.

Then, the p-type GaAs layer 3 is formed on the n-type GaAs layer 2 by doping zinc through diffusion or MOCVD. Thus, the p-n junction 4 is defined between the p-type GaAs layer 3 and the n-type GaAs layer 2.

Thereafter the p-type GaAs layer 3 is doped with an element of the group II such as zinc, beryllium or magnesium, so that the p-type AlGaAs layer 6 is formed on the p-type GaAs layer 3.

Then the antireflection film 7 of silicon nitride is formed on the surface of the p-type AlGaAs layer 6 through a process such as CVD (chemical vapor deposition).

Thereafter the n-type GaAs layer 2, the p-type GaAs layer 3, the p-type AlGaAs layer 6 and the antireflection film 7 are selectively etched to expose parts 1a and 1b of the surface of the semi-insulation GaAs substrate 1. Then the p-type GaAs layer 3, the p-type A GaAs 6 and the antireflection film 7 are selectively etched to expose a part 2a of the surface of the n-type GaAs layer 2. Further, the p-type AlGaAs layer 6 and the antireflection film 7 are selectively etched to expose parts 3a and 3b of the surface of the p-type GaAs layer 3.

As shown in FIG. 2, the heatproof insulating film 9 of silicon nitride, silicon oxide or polyimide is formed over the part 1a of the exposed surface of the semi-insulation GaAs substrate 1, the side surfaces of the n-type GaAs layer 2 and the p-type GaAs layer 3 including the p-n junction 4 and the part 3b of the exposed surface of the p-type GaAs layer 3.

Then the electrode 5 is formed on the insulating film 9, the part 1b of the exposed surface of the semi-insulation GaAs substrate 1 and the part 3a of the exposed surface of the p-type GaAs layer 3 to be in ohmic contact with the p-type GaAs layer 3 only on the part 3a. This electrode 5 has a region 5a to be connected with an external lead terminal (not shown) on the part 1a of the surface of the semi-insulation GaAs substrate 1.

Finally, an electrode 8 is formed on the part 2a of the surface of the n-type GaAs layer 2, to thereby complete the semiconductor device having photoelectric conversion function. The antireflection film 7 may be formed after formation of the electrode 5.

Figure 1:
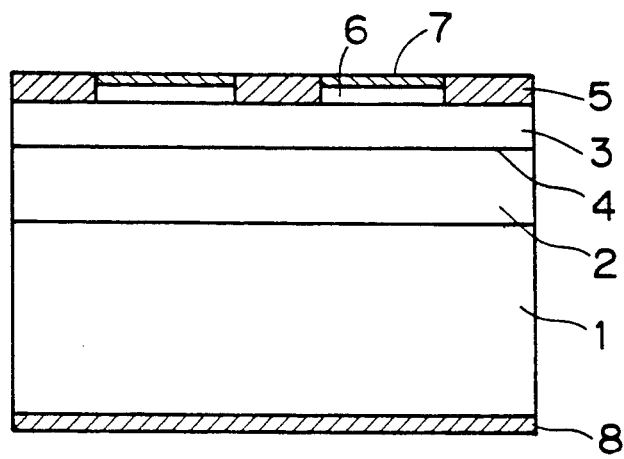
FIG. 1 is a sectional view showing a conventional semiconductor device having photoelectric conversion function.

In the conventional semiconductor device shown in FIG. 1, the p-type GaAs layer 3 and the p-n junction 4 are easily mechanically damaged since the electrodes 5, being in ohmic connection with the p-type GaAs layer 3, are bonded to external lead terminals (not shown) on the p-type GaAs layer 3. In the inventive semiconductor device having photoelectric conversion function manufacture through the aforementioned method, however, the region 5a of the electrode 5 to be bonded with the external lead terminal (not shown) is provided on the part 1b of the surface of the semi-insulation GaAs substrate 1.

According to this embodiment, therefore, the electrode 5 is connected with the external lead terminal (not shown) at the region 5a provided on the part 1b of the surface of the sei-insulation GaAs substrate 1, to thereby reduce mechanical damage to the p-type GaAs layer 3, the n-type GaAs layer 2 and the p-n junction 4 having photoelectric conversion function. Further, according to this embodiment, the electrode 5 can be formed directly on the part 1b of the surface of the substrate 1 without providing an insulation film between them since the substrate 1 is insulator. As a result, the electrode 5 can strongly adhere on the substrate 1 to prevent separation, and therefore a semiconductor device of high reliability can be implemented.

Figure 3A:
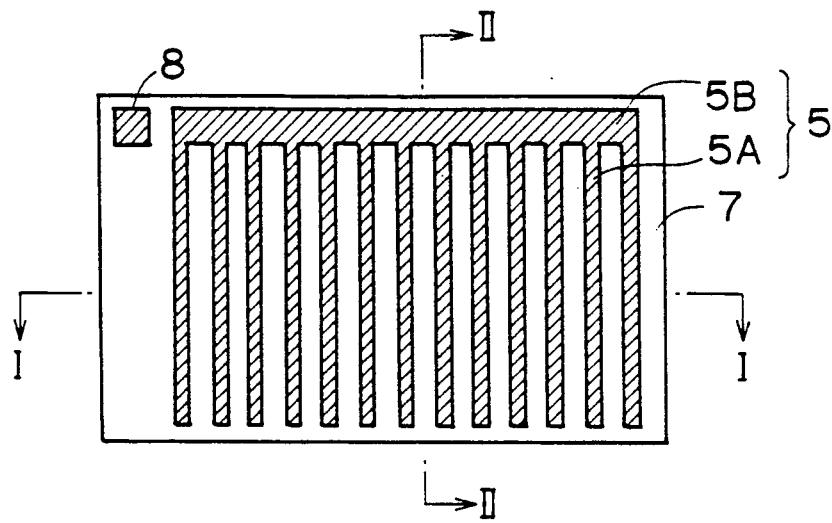
FIG. 3(a) is a plan view showing a semiconductor device having photoelectric conversion function according to another embodiment of the present invention.
Figure 3B:
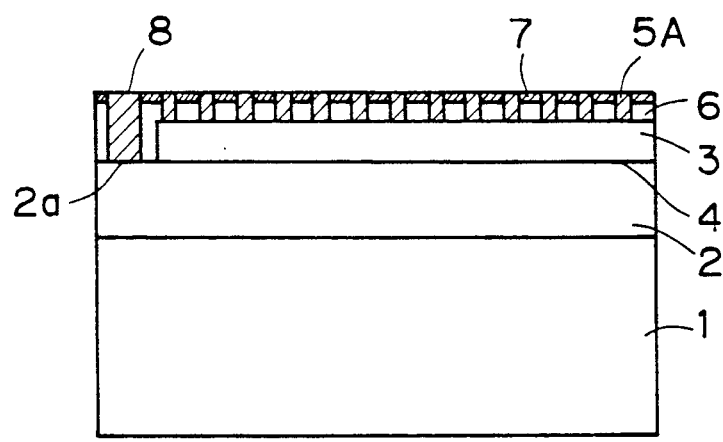
FIG. 3(b) is a cross-sectional view taken along the line I—I of FIG. 3(a)
Figure 3C:
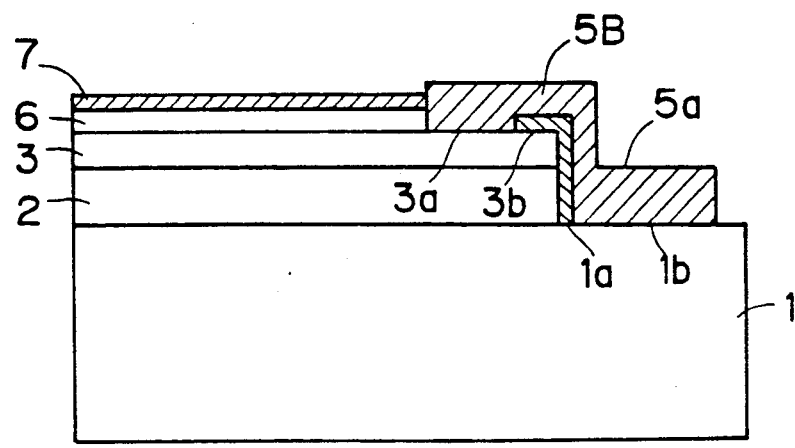
FIG. 3(c) is a cross-sectional view taken along the line II—II of FIG. 3(a).

FIG. 3(a) is a plan view showing a semiconductor device having photoelectric conversion function according to another embodiment of the present invention, and FIG. 3(b) and FIG. 3(c) are cross-sectional views taken along the lines I—I and II—II of FIG. 3(a), respectively. The structure illustrated in FIG. 3(c) is substantially the same with that illustrated in FIG. 2 according to the aforementioned embodiment.

Referring to FIGS. 3(a) to 3(c), an electrode 5 consists of a grid electrode 5A, which is formed in comb-type shape to efficiently lead a light to a p-n junction 4, and a bar electrode 5B for connection to a external lead terminal (not shown). In FIG. 3(c), the bar electrode 5B is shown in enlarged manner for convenience of illustration.

The bar electrode 5B has a portion 5a to be connected with the external lead terminal on a part 1b of the surface of semi-insulation GaAs substrate 1, similarly to the electrode 5 shown in FIG. 2, to obtain similar advantages to the embodiment shown in FIG. 2. Further, photoelectromotive voltage and photoelectromotive current can be efficiently collected by the electrode 5, since the comb-type grid electrode 5A is provided on a p-type GaAs layer 3.

Although the above embodiment has been described with reference to a GaAs photoelectric conversion device, the present invention is also applicable to a semiconductor device which has an active layer (e.g., epitaxial layer, diffusion layer and ion-implanted layer) on a semiconductor substrate. The semi-insulation GaAs substrate 1 may be replaced by other substrate of insulator.

In the semiconductor device according to the present invention as hereinabove described, the region of the electrode to be bonded with the external lead terminal is provided on the insulation substrate so that bonding is performed on this bonding region to prevent the n-type semiconductor layer and the p-type semiconductor layer defining the p-n junction from mechanical damage caused by bonding, to thereby improve photoelectric conversion efficiency and reliability of the device. Further, the electrode can be formed directly on the substrate of insulator to increase stability of electrode structure.

Although the present invention has been described and illustrated in detail, it is clearly understood that the same is by way of illustration and example ony and is not to be taken by way of limitation, the spirit and scope of the present invention being limited only by the terms of the appended claims.

What is claimed is:

1. A semiconductor device comprising:
   an insulation substrate;
   a first conductivity type first semiconductor layer formed partially on a surface of said insulation substrate;
   a second conductivity type second semiconductor layer formed partially on a surface of said first semiconductor layer;
   and insulating film formed to extend from a part of the surface of said insulation substrate not provided thereon with said first semiconductor layer to a part of a surface of said second semiconductor layer;
   a first electrode formed on another part of the surface of said insulation substrate not provided thereon with said first semiconductor layer, a surface of said insulating film and another part of the surface of said second semiconductor layer, and electrically bonding connected with said second semiconductor layer on said another part of the surface of said second semiconductor layer, a region of said first electrode on said another part of the surface of said insulation substrate serving as a region to be connected with an external terminal; and
   a second electrode formed on a part of the surface of said first semiconductor layer not provided thereon with said second semiconductor layer, with being insulated from said second semiconductor layer.

2. A semiconducor device in accordance with claim 1, wherein
   said first conductivity type is n-type and said second conductivity type is p-type.

3. A semiconductor device in accordance with claim 1, wherein
   said first semiconductor layer and said second semiconductor layer are prepared by GaAs,
   said semiconductor device having photoelectric conversion function.

4. a semiconductor device in accordance with claim 1, wherein the planar structure of said first electrode includes a comb-type electrode portion on said another part of the surface of said second semiconductor layer.

* * * * *